US009496712B1

(12) United States Patent
Aipperspach et al.

(10) Patent No.: US 9,496,712 B1
(45) Date of Patent: Nov. 15, 2016

(54) ELECTROSTATIC DISCHARGE PROTECTION DEVICE WITH POWER MANAGEMENT

(71) Applicant: International Business Machines Corporation, Armonk, NY (US)

(72) Inventors: Anthony G. Aipperspach, Rochester, MN (US); Derick G. Behrends, Rochester, MN (US); Todd A. Christensen, Rochester, MN (US); David W. Siljenberg, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/088,219

(22) Filed: Apr. 1, 2016

Related U.S. Application Data

(63) Continuation of application No. 14/701,626, filed on May 1, 2015.

(51) Int. Cl.
*H02H 9/04* (2006.01)
*H01L 29/20* (2006.01)
*H01L 29/778* (2006.01)
*H02H 3/22* (2006.01)

(52) U.S. Cl.
CPC .......... *H02H 9/046* (2013.01); *H01L 29/2003* (2013.01); *H01L 29/7787* (2013.01); *H02H 3/22* (2013.01)

(58) Field of Classification Search
CPC .......... H01L 29/7787; H01L 29/2003; H02H 9/046; H02H 3/22
See application file for complete search history.

(56) References Cited

U.S. PATENT DOCUMENTS

| 5,218,506 | A |   | 6/1993  | Harris |
|-----------|---|---|---------|--------|
| 5,543,734 | A | * | 8/1996  | Volk ................... H01L 27/0266 326/33 |
| 6,256,184 | B1|   | 7/2001  | Gauthier Jr. et al. |
| 7,196,887 | B2|   | 3/2007  | Boselli et al. |
| 7,706,113 | B1| * | 4/2010  | Lien .................... H01L 27/0285 361/111 |
| 8,030,660 | B2| * | 10/2011 | Saito ................... H01L 29/7787 257/192 |

(Continued)

FOREIGN PATENT DOCUMENTS

KR           100631957 B1      10/2006

OTHER PUBLICATIONS

Ker et al., "Novel Electrostatic Discharge Protection Design for Nanoelectronics in Nanoscale CMOS Technology," 2003 Third IEEE Conference on Nanotechnology, Aug. 12-14, 2003, pp. 737-740, vol. 2, Copyright 2003 IEEE DOI: 10.1109/NANO.2003.1231018.

(Continued)

*Primary Examiner* — Zeev V Kitov
(74) *Attorney, Agent, or Firm* — Nicholas D. Bowman

(57) ABSTRACT

An electrostatic discharge (ESD) protection device to manage leakage current can, in response to a power good (PGOOD) signal, draw the gate terminal of an ESD clamp device to a voltage below ground. The device also drives an inverted copy of the PGOOD signal to a gated inverter, which can inhibit the gated inverter output from drawing the ESD clamp device gate terminal to ground. The ESD protection device also includes the ESD clamp device to, in response to the gate terminal of the ESD clamp device being drawn to a bias voltage less than ground, allow a leakage current to flow through the ESD clamp device that is less than a leakage current allowed to flow in response to the ESD clamp device gate terminal being drawn to ground.

1 Claim, 3 Drawing Sheets

(56) References Cited

U.S. PATENT DOCUMENTS

| | | |
|---|---|---|
| 8,711,533 B2 | 4/2014 | Tatsumi |
| 2008/0062597 A1* | 3/2008 | Chen .................. H01L 27/0251 361/56 |
| 2008/0099090 A1* | 5/2008 | Cook .................. F15B 13/0402 137/625.65 |
| 2015/0249334 A1 | 9/2015 | Chen et al. |
| 2015/0318275 A1 | 11/2015 | Chen et al. |

OTHER PUBLICATIONS

Aipperspach et al., "Electrostatic Discharge Protection Device With Power Management", U.S. Appl. No. 14/701,626, filed May 1, 2015.

IBM, List of IBM Patents or Patent Applications Treated as Related, Jul. 14, 2016, 2 pages.

* cited by examiner

ELECTROSTATIC DISCHARGE PROTECTION DEVICE WITH POWER MANAGEMENT

BACKGROUND

The present disclosure generally relates to an electrostatic discharge (ESD) protection device fabricated within an electrical component. In particular, the present disclosure relates to features of an ESD protection device that can be activated to manage the power consumption of the ESD protection device.

Electrostatic discharge (ESD) can be the sudden flow of electricity between two electrically charged objects which may be initiated by physical contact, an electrical short circuit, or the electrical breakdown of a dielectric material. In certain cases, ESD events can include electric sparks such as lightning or electrical arcing between conductive elements. ESD events can also include less obvious forms which may be neither seen nor heard, but which can involve a voltage potential sufficient to cause damage to sensitive electronic devices. For example, ESD events can cause permanent damage to small features of integrated circuits (ICs) such as dielectric layers, interconnect metal and contacts.

SUMMARY

Various aspects of the present disclosure can be useful for managing and limiting leakage current flow through an electrostatic discharge (ESD) protection device while the device is in an "idle" or "off" state. An ESD protection device configured according to embodiments of the present disclosure can limit power consumption and heating within an integrated circuit (IC) containing the ESD protection device.

Embodiments can be directed towards an electrostatic discharge (ESD) protection device to manage leakage current. The ESD protection device includes a first N-channel field-effect transistor (NFET) configured to, in response to receiving a power good (PGOOD) signal at a gate terminal of the first NFET, draw a gate terminal of an ESD clamp device to a bias voltage less than ground. The ESD clamp device is configured to, in response to the gate terminal of the ESD clamp device being drawn to the bias voltage less than ground, allow a first leakage current to flow through the ESD clamp device. The ESD clamp device is also configured to, in response to the gate terminal of the ESD clamp device being drawn to ground, allow a second leakage current to flow through the ESD clamp device. The first leakage current can be less than the second leakage current. The ESD protection device also includes an inverter configured to, in response to receiving the PGOOD signal at an input of the inverter, drive an inverted copy of the PGOOD signal (PGOOD_N) to an enable input of a gated inverter. The ESD protection device includes the gated inverter, the gated inverter including an output coupled to the gate terminal of the ESD clamp device. The gated inverter also includes a second NFET, the second NFET having a source terminal connected to ground, a drain terminal connected to a source terminal of a third NFET. The second NFET also has a gate terminal connected to the enable input of the gated inverter. The second NFET is configured to, in response to receiving the PGOOD_N signal, inhibit the output of the gated inverter from drawing the gate terminal of the ESD clamp device to ground.

Embodiments may be directed towards an integrated circuit (IC). The IC can include an electrostatic discharge (ESD) protection device. The ESD protection device includes a first N-channel field-effect transistor (NFET) configured to, in response to receiving a power good (PGOOD) signal at a gate terminal of the first NFET, draw a gate terminal of an ESD clamp device to a bias voltage less than ground. The ESD clamp device is configured to, in response to the gate terminal of the ESD clamp device being drawn to the bias voltage less than ground, allow a first leakage current to flow through the ESD clamp device. The ESD clamp device is also configured to, in response to the gate terminal of the ESD clamp device being drawn to ground, allow a second leakage current to flow through the ESD clamp device. The first leakage current can be less than the second leakage current. The ESD protection device also includes an inverter configured to, in response to receiving the PGOOD signal at an input of the inverter, drive an inverted copy of the PGOOD signal (PGOOD_N) to an enable input of a gated inverter. The ESD protection device includes the gated inverter, the gated inverter including an output coupled to the gate terminal of the ESD clamp device. The gated inverter also includes a second NFET, the second NFET having a source terminal connected to ground, a drain terminal connected to a source terminal of a third NFET. The second NFET also has a gate terminal connected to the enable input of the gated inverter. The second NFET is configured to, in response to receiving the PGOOD_N signal, inhibit the output of the gated inverter from drawing the gate terminal of the ESD clamp device to ground.

Embodiments may be directed towards a design structure tangibly embodied in a machine-readable storage medium used in a design process of an electrostatic discharge (ESD) protection device, the design structure having elements that, when processed in a semiconductor manufacturing facility, produce an ESD protection device. The ESD protection device includes a first N-channel field-effect transistor (NFET) configured to, in response to receiving a power good (PGOOD) signal at a gate terminal of the first NFET, draw a gate terminal of an ESD clamp device to a bias voltage less than ground. The ESD clamp device is configured to, in response to the gate terminal of the ESD clamp device being drawn to the bias voltage less than ground, allow a first leakage current to flow through the ESD clamp device. The ESD clamp device is also configured to, in response to the gate terminal of the ESD clamp device being drawn to ground, allow a second leakage current to flow through the ESD clamp device. The first leakage current can be less than the second leakage current. The ESD protection device also includes an inverter configured to, in response to receiving the PGOOD signal at an input of the inverter, drive an inverted copy of the PGOOD signal (PGOOD_N) to an enable input of a gated inverter. The ESD protection device includes the gated inverter, the gated inverter including an output coupled to the gate terminal of the ESD clamp device. The gated inverter also includes a second NFET, the second NFET having a source terminal connected to ground, a drain terminal connected to a source terminal of a third NFET. The second NFET also has a gate terminal connected to the enable input of the gated inverter. The second NFET is configured to, in response to receiving the PGOOD_N signal, inhibit the output of the gated inverter from drawing the gate terminal of the ESD clamp device to ground.

Aspects of the various embodiments can be used to manage on-chip power supply droop and variation resulting from excess leakage current. Aspects of the various embodiments can also be useful for providing enhanced reliability and power supply stability for ICs incorporating an ESD protection device, by using existing and proven circuit design and simulation practices, and IC fabrication technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
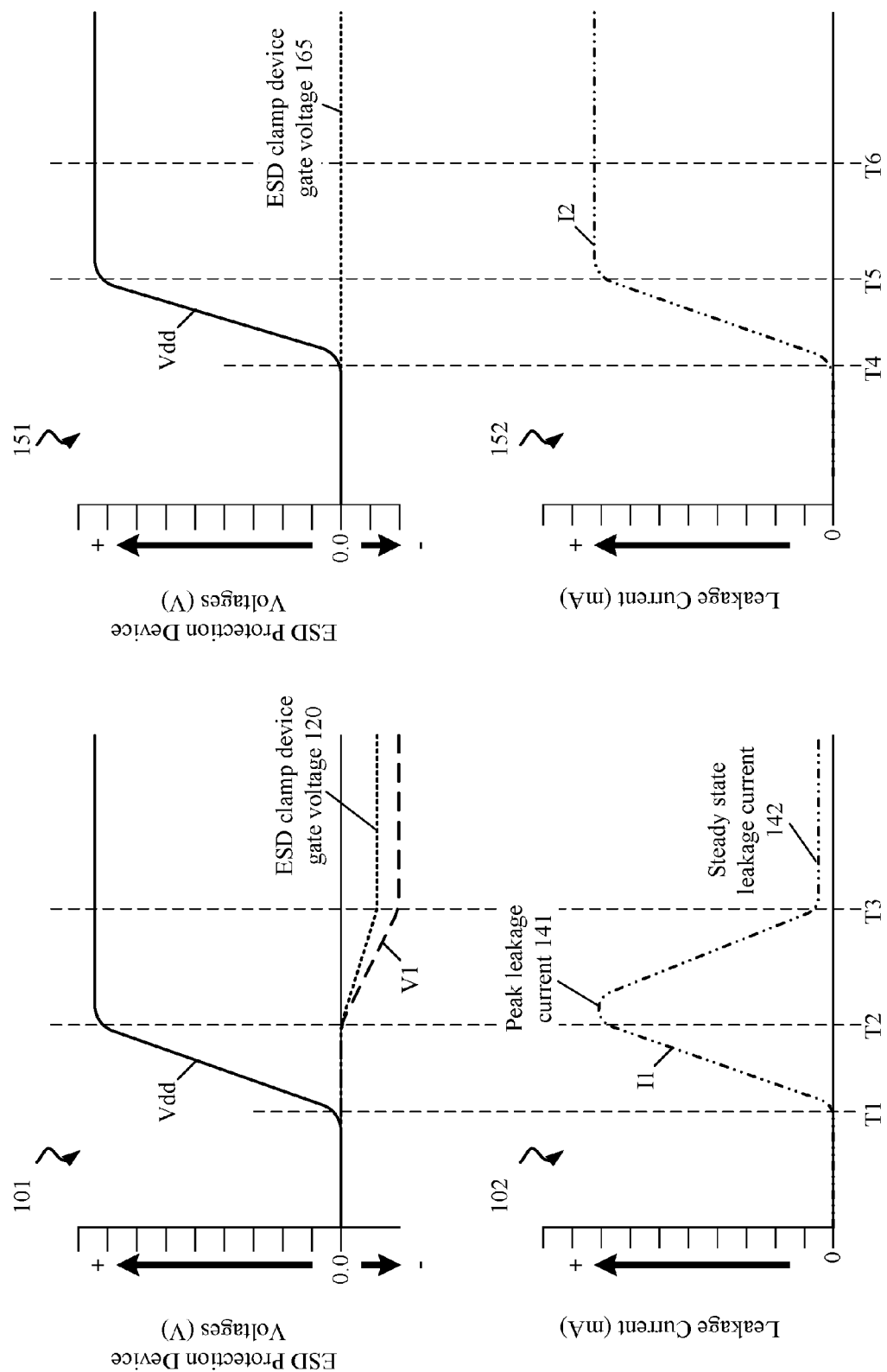
FIG. 1 depicts voltage and current waveforms in an electrostatic discharge (ESD) protection device when a clamp logic circuit is configured to apply a negative bias voltage to the ESD clamp gate, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

The present disclosure can be an electronic device, an integrated circuit including the electronic device, and/or a design structure used in a design and/or production processes of the electronic device. Aspects of the present disclosure relate to electrostatic discharge (ESD) protection devices. Particular aspects of the present disclosure relate to circuits that can manage or reduce leakage current through ESD protection devices by applying a negative bias voltage to a gate terminal of an ESD clamp device. According to embodiments of the present disclosure, an ESD clamp device can include a large N-channel field-effect transistor (NFET) having multiple channel areas, each of which can leak current when the NFET is in an idle or "off" state.

In certain embodiments, the electronic device can provide an integrated circuit (IC) with protection from ESD events resulting from insertion or removal of a printed circuit board (PCB) containing the IC from a computer or other electronic system.

After a PCB containing the IC, including the ESD protection device, has been inserted into the electronic system, the ESD protection device will generally remain idle while the supply voltage(s) within the system remains stable. Leakage current through an ESD clamp device, e.g., a large NFET, can be significant in certain embodiments of ESD protection devices. The application of a negative bias voltage to a gate of an NFET used as an ESD clamp device can significantly reduce the amount of leakage current that can flow through the ESD clamp device. In certain embodiments, a negative bias voltage can be applied to an NFET or ESD clamp device gate terminal in response to an electronic system providing a "power good" (PGOOD) signal to a clamp logic circuit connected to an ESD clamp device.

The PGOOD signal can be used by a computer or other electronic system to indicate that all power supplies within the system have reached stable, specified operating voltage(s). While the present disclosure is not necessarily limited to such applications, various aspects of the disclosure can be appreciated through a discussion of various examples using this context.

As semiconductor fabrication processes have advanced, "off-state" leakage currents through active devices such as transistors have generally increased with each successive generation of semiconductor technology. An "off-state" leakage current can flow through the channel(s) of a transistor, e.g., an NFET, when a gate voltage of the NFET is below an NFET threshold voltage (VTN). Consequently, power dissipation due to "off-state" leakage currents can comprise an increasing portion of the total power dissipated within an IC during its operation.

ESD protection devices may include relatively large transistors, such as NFETs, also referred to as "power clamps", to provide protection of ICs and power supplies from ESD damage during initialization of the power supply voltage(s). The large size of the devices used as power clamps can contribute a significant amount of current leakage to an IC. For ease of discussion, the terms "power clamp" and "ESD clamp device" are used interchangeably herein, in reference to a semiconductor device used to provide a low-impedance current shunt path between a supply voltage, e.g., Vdd, and ground.

Certain embodiments relate to ESD protection devices that can be used for programmable management of leakage current when the power clamp device is in an "idle" or "off" state. FIG. 1 depicts four waveform views 101, 102, 151 and 152 representing voltages and currents in ESD protection devices, according to embodiments. More specifically, waveform views 101 and 102 represent voltages and currents in an ESD protection device, e.g., 200, FIG. 2, having a clamp logic circuit that is configured to apply a negative bias voltage to the ESD clamp device, e.g., 241, FIG. 2, gate terminal G. The waveform views 151 and 152 represent voltages and currents in an ESD protection device lacking such a clamp logic circuit. View 101 depicts waveforms for voltages that are present at various locations in certain embodiments of an ESD protection device having a clamp logic circuit. While specific examples of voltages and currents can be described in reference to views 101, 102, 151 and 152, these views can be generally representative of voltages and currents present in multiple embodiments of ESD protection devices and are not limiting in any way.

Figure 2:
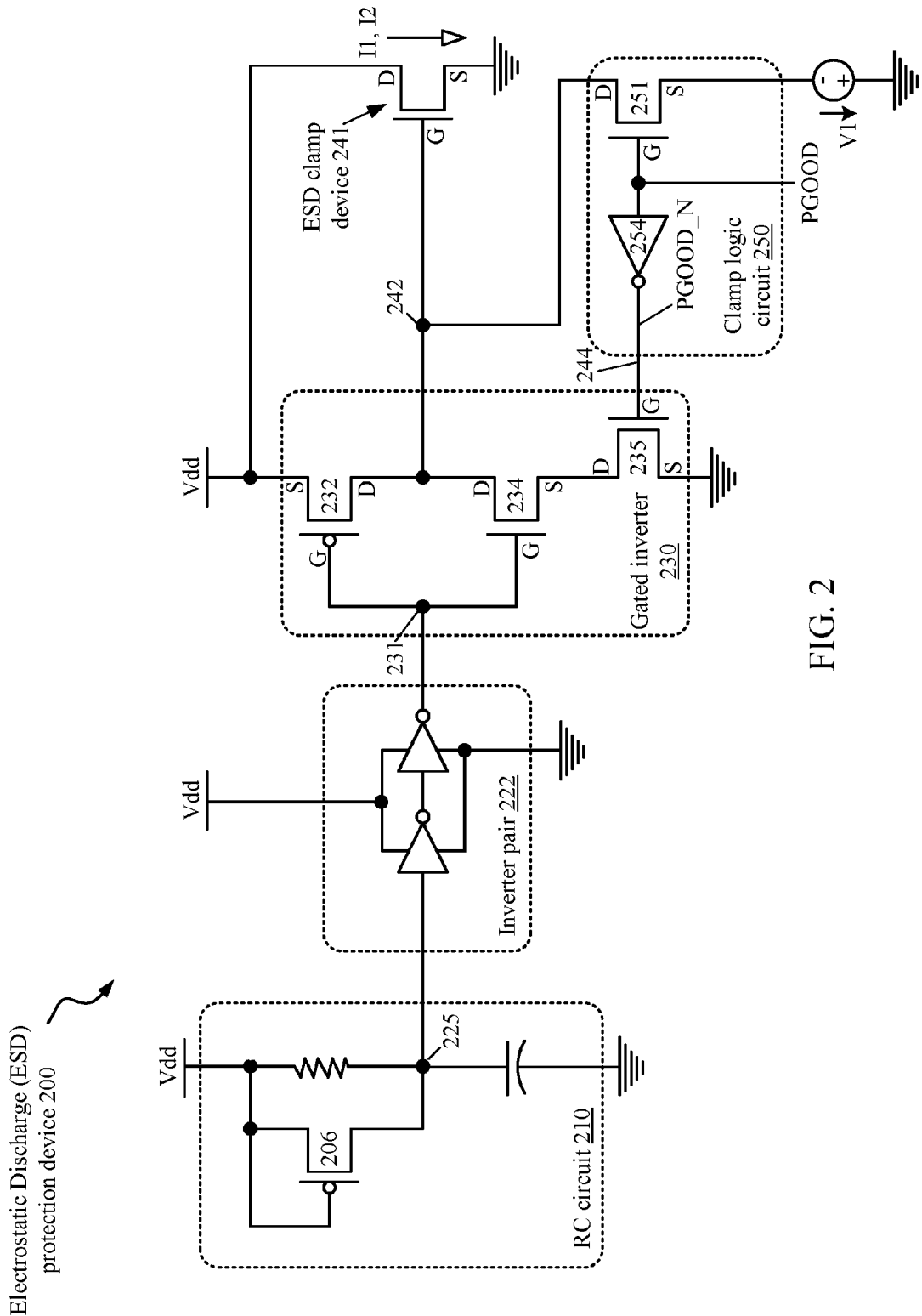
FIG. 2 depicts an ESD protection device with a clamp logic circuit coupled to an ESD clamp, according to embodiments.

View 101 depicts the timing of the application of voltages to various ESD protection circuit nodes and includes waveforms depicting bias voltage V1, supply voltage Vdd, and ESD clamp device gate voltage 120 applied to the gate terminal G of the ESD clamp device, e.g., NFET 241, FIG. 2. ESD clamp device gate voltage 120 can be applied in response to the logic high level of the PGOOD signal being received by a clamp logic circuit, e.g., 250, FIG. 2, connected to the ESD clamp device, according to embodiments.

The supply voltage (Vdd) can be the main supply voltage, or a voltage supplied to the ESD protection device, used to power a device such as an IC that is electrically connected to a PCB. In certain embodiments, Vdd can be in a range between 0.5 V and 3.0 V, with respect to ground. A PCB can be a graphics, memory or networking card, or some other electrical module being inserted into a socket in a computer system or onto a computer motherboard. The bias voltage V1 can be supplied to a clamp logic circuit by an external voltage source or from within the electronic system. In embodiments, the bias voltage V1 can be useful as a negative bias voltage, with respect to ground, when applied by the clamp logic circuit to the gate of ESD clamp device. The clamp logic circuit can be configured to apply the bias voltage V1 to the gate of an ESD clamp device, in order to manage or reduce "off-state" leakage current through the ESD clamp device. The ESD clamp device gate voltage waveform 120 represents the voltage at the gate of the ESD clamp device applied by the clamp logic circuit, and is generally of smaller magnitude than the bias voltage V1.

The supply voltage Vdd can be applied to an ESD protection device beginning at time T1, which can correspond to a system event such as the insertion of a PCB (containing an IC having the ESD protection device) into a powered socket, or applying power to an already inserted PCB. The voltage Vdd can rise to a steady level between time T1 and time T2, in some embodiments, or may be in the process of reaching a steady value, when the bias voltage V1 is supplied to the ESD protection device. In embodiments, the bias voltage V1 is supplied to the ESD clamp device in response to the clamp logic circuit receiving a signal to apply bias voltage V1 to a field-effect transistor (FET) within the ESD clamp device. The bias voltage V1 and the ESD clamp device gate voltage 120 can achieve steady-state values at time T3.

According to certain embodiments of an ESD protection device, the Vdd voltage can increase from approximately 0.0 V at time T1 to approximately 0.85 V by time T2, after which Vdd can remain approximately constant. The bias voltage V1 can be supplied from the clamp logic circuit to the ESD clamp device gate, transitioning from approximately 0.0 V at time T2 to approximately −0.2 V, relative to ground at time T3. The ESD clamp device gate voltage 120 can transition from approximately 0.0 V at time T2 to approximately −1.5 V at time T3, whereupon the bias voltage V1 and voltage 120 achieve steady-state values and remain approximately constant beginning at time T3. The particular voltages and currents described in the various embodiments of the present disclosure are not intended to be limiting to the scope of the present disclosure. A range of voltages and currents can be applied to and observed in the various embodiments while remaining true to the inventive concept described herein. Particular voltages and currents can vary based on sizes, topologies and types of the circuits described herein.

View 102 includes a waveform depicting a leakage current I1 that can flow through an ESD protection device similar to that previously depicted and described with reference to view 101. The shape of the leakage current I1 waveform is representative of leakage currents corresponding to the application of a negative bias voltage V1 to an ESD clamp device gate. The currents depicted in view 102 and other waveform views may be representative of those present in multiple embodiments of ESD protection devices.

The leakage current I1 can initially rise, starting at time T1, to a peak leakage current 141 at approximately time T2, and then can drop to a lower steady-state leakage current 142 at approximately time T3. The decrease in leakage current from the peak leakage current 141 at time T2 to the lower leakage current 142 at time T3 can be attributed to the negative bias voltage being applied to the ESD clamp device gate terminal. The negative bias voltage is depicted in the value of the ESD clamp device voltage 120 decreasing from time T2 to time T3, view 101. According to certain embodiments, the leakage current I1 may increase from approximately 0.0 mA at time T1 to approximately 840 mA at time T2, and then may subsequently decrease to approximately 50 mA by time T3. In certain embodiments, the leakage current I1 can decrease over 20% from the peak leakage current 141 after application of the bias voltage V1 to the ESD clamp device gate terminal through the clamp logic circuit. In particular embodiments, the leakage current I1 may decrease by more than 50% from the peak leakage current 141.

View 151 depicts voltages present at various nodes within an ESD protection device when the PGOOD signal is not received by a clamp logic circuit connected to the ESD clamp device, according to embodiments. The voltage waveform Vdd may rise from approximately 0.0 V at time T4, corresponding approximately to time T1 in views 101 and 102, to a high, steady-state voltage by time T5, corresponding to time T2, view 101. In certain embodiments, when the ESD protection device is present in an IC, but not being employed to protect the IC from an ESD event, the ESD clamp device gate voltage 165 can remain at approximately 0.0 V, for example, as depicted from time T4 to time T6.

View 152 includes a waveform depicting a leakage current I2 which can be present in an ESD protection device lacking an employed clamp logic circuit described with respect to view 151, according to embodiments. The leakage current I2 can increase from approximately 0.0 mA at time T4 to approximately 800 mA at time T5, after which it may become approximately constant. Current I2 becoming approximately constant may correspond to Vdd also becoming approximately constant within an ESD clamp device connected to the clamp logic circuit.

The ESD clamp device gate voltage 165, and the leakage current I2, may remain approximately constant from time T5 until time T6, in response to a PGOOD signal not being received by a clamp logic circuit connected to the ESD clamp device. Time T6 corresponds approximately to time T3, views 101, 102. In the absence of the clamp logic circuit applying a negative bias voltage to the ESD clamp device gate terminal, the leakage current I2 may remain at a relatively high level compared to leakage current I1.

FIG. 2 depicts an ESD protection device 200 which includes a clamp logic circuit 250, a gated inverter 230 and an ESD clamp device 241. The ESD protection device 200 includes, in certain embodiments, a resistor-capacitor (RC) circuit 210 and at least one series-coupled inverter pair 222. The ESD protection device 200 can be useful for providing an IC with ESD protection while managing or reducing "off-state" leakage current flowing through the ESD clamp device 241.

In various embodiments, the ESD clamp device 241 can be an NFET having a large number of channel areas between the NFET's source terminal S and drain terminal D, which may be useful for providing a low-impedance current shunt path between a supply voltage Vdd and ground. For example, in certain embodiments, the ESD clamp device 241 may have over 85,000 parallel and interconnected channels. The ESD clamp device 241 can be sized to sink current generated during an ESD event resulting from the insertion of a PCB into, or removal from, a slot or a socket in a computer or other electronic system. Examples of PCBs or other electronic modules that can contain ICs with ESD protection devices can include graphics, network or processing cards, memory modules, and storage devices such as solid-state drives.

The large number of interconnected channels within ESD clamp device 241 can be effective in reducing its "on-state" impedance to a very low value when a voltage applied to the gate terminal G is greater than an NFET threshold value VTN. For example, an "on-state" impedance can be less than 0.1Ω, in certain embodiments. This low-impedance can be useful for dissipating excess charge resulting from an ESD event to ground, and limiting the range of the supply voltage Vdd.

In embodiments, the large number of interconnected channels within ESD clamp device 241 can also contribute to a relatively large amount of leakage current I2 between the drain terminal D and source terminal S of the ESD clamp device 241. In some embodiments, for example, an "off state" leakage current I2 can be approximately 800 µA, when a voltage applied to the gate terminal G is approximately 0.0 V with respect to ground. This leakage current I2, possibly in combination with other, similar leakage currents, can contribute to a significant portion of the total power dissipation of an IC.

According to embodiments, applying a voltage to the gate terminal G that is less than ground can result in a significantly reduced "off state" leakage current I1, relative to leakage current I2. For example, in certain embodiments, applying a voltage of −0.15 V to the gate terminal G of ESD clamp device 241 may result in a leakage current I1 of approximately 50 µA. In certain embodiments, leakage current I2 may be greater than 10 times that of leakage current I1. The reduction of leakage current from leakage current I2 to leakage current I1 can be useful in reducing overall power consumption of an IC containing ESD protection device 200.

According to certain embodiments, a gated inverter output 242 of a gated inverter 230 is coupled to the gate terminal G of ESD clamp device 241. Gated inverter 230 includes a PFET 232 having a source terminal S coupled to supply voltage Vdd, a gate terminal G coupled to gated inverter input 231, and a drain terminal D coupled to gated inverter output 242 and to the gate terminal G of ESD clamp device 241.

Consider a scenario where ESD protection device 200 may be in a completely "inactive" state, for example, when an IC containing ESD protection device 200 is mounted on a PCB that is electrically disconnected from any power sources. In such a scenario, the circuit nodes Vdd, ground, gated inverter input 231 and gated inverter output 242 can all be initially at 0.0 V. If an ESD event occurs that elevates the voltage of the supply voltage Vdd node at least a PFET threshold voltage ($V_{TP}$) above the voltage of gate terminal G and drain terminal D of PFET 232, which may remain at ground, then PFET 232 can conduct current to gated inverter output 242 and the gate terminal G of ESD clamp device 241, raising the ESD clamp's gate voltage above a VTN of the ESD clamp device 241, causing it to be turned on.

Once ESD clamp device 241 begins to conduct current, in response to the increased voltage on its gate terminal G and drain terminal D, relative to its source terminal S, ESD clamp device 241 can conduct current from its drain terminal D to its source terminal S, and effectively bleed off any excess charge/voltage on supply voltage Vdd resulting from the ESD event. PFET 232 in conjunction with ESD clamp device 241 can therefore be useful in protecting an IC containing ESD protection device 200 with effective protection from ESD events when supply voltage Vdd supply is not active.

A power-up operation of an electronic system, such as a computer, that includes an IC with ESD protection device 200, may occur once the IC is electrically connected to a supply voltage such as Vdd. This can occur, for example, after a PCB containing the IC is inserted into a connector within the computer or electronic system.

At the beginning of a "power-up" operation, the voltages on all circuit nodes within ESD protection device 200 can initially be at 0.0 V. Upon activation of a power supply that provides supply voltage Vdd to ESD protection device 200, the supply voltage Vdd may begin to rise from 0.0 V. The electronic system can be designed to generate a PGOOD signal that remains at a logic low level until all power supplies, including the supply voltage Vdd supply, have reached a specified and stable operating voltage.

ESD protection device 200 includes an RC circuit 210, configured to generate a "voltage supply active" signal at RC circuit output 225 once the Vdd supply voltage node has risen and reached a specified Vdd value. In certain embodiments, RC circuit output 225 can be coupled directly to gated inverter input 231, and in certain embodiments inverter pair 222 can be used to couple RC circuit output 225 to gated inverter input 231. The "voltage supply active" signal may remain at a logic low level until supply voltage Vdd has reached the specified value, at which point may begin to transition to a logic high level. In certain embodiments, RC circuit 210 may also include a PFET 206 connected between the Vdd node and RC circuit output 225.

ESD protection device 200 contains clamp logic circuit 250, which includes inverter 254, configured with an input to receive the PGOOD signal, and drive an inverted copy PGOOD_N of the PGOOD signal to gated inverter enable input 244 of gated inverter 230. While PGOOD remains at a low level, PGOOD_N can remain at a high level, which when applied to the gate of NFET 235 can turn on NFET 235. When NFET 235 is turned on, the configuration of NFET 234 and PFET 232 allows them to drive an inverted copy of the logic value of the signal received on gated inverter input 231 onto gated inverter output 242. If, for example the signal on gated inverter input 231 is a logic low value, indicating that the supply voltage Vdd has not yet reached a specified value, then the logic value driven on gated inverter output 242 will be a high value, turning on ESD clamp device 241. When ESD clamp device 241 is turned on it can create a low-impedance current shunt path to effectively clamp supply voltage Vdd to ground, which can mitigate the effects of ESD events during a power-up operation.

Once the supply voltage Vdd has reached its specified value, the RC circuit 210 outputs a logic high signal, which can drive gated inverter input 231 of gated inverter 230. Gated inverter 230 can respond by driving a logical low value to gated inverter output 242, which can result in ESD clamp device 241 being turned off, to a high-impedance state. Turning off ESD clamp device 241 once the Vdd voltage has reached its specified value may be useful in reducing power consumption, excess heating, and ensuring a stable and robust supply voltage Vdd to the IC, once the clamping function of ESD clamp device 241 is complete. In embodiments, a power supply such as that used to provide supply voltage Vdd may have an impedance low enough to mitigate ESD events once the power supply output has reached its specified voltage and the power supply is fully active.

In embodiments, RC circuit 210 in conjunction with gated inverter 230, and in certain embodiments, inverter pair 222, can be useful in providing a signal to enable the ESD clamp device 241, during a power-up operation, which can be effective in protecting an IC against ESD damage. The signal may also be useful to disable ESD clamp device 241 once the power-up operation is complete.

In embodiments, inverter pair 222 can be useful for buffering the "voltage supply active" signal, and providing a delay between RC circuit output 225 and gated inverter input 231. The number of inverter pair(s) 222 can be specified in order to provide a particular delay value between RC circuit output 225 and gated inverter input 231, which can be useful in turning off ESD clamp device 241 at a time corresponding to supply voltage Vdd reaching a particular voltage.

According to embodiments, gated inverter output 242 can drive the gate of ESD clamp device 241 to 0.0 V, which can result in a leakage current I2 between the drain terminal D and the source terminal S of ESD clamp device 241.

When all of the supply voltage(s) of an IC containing ESD protection device 200 have reached their respective specified and stable values, the computer or electronic system can drive the PGOOD signal to a logic high value. Inverter 254 can respond by driving an inverted copy PGOOD_N of the signal having a logic low value to the gate of NFET 235, which can inhibit gated inverter 230 from drawing gated inverter output 242 to a 0.0 V level. The PGOOD signal high logic level can also be received at the gate terminal G of NFET 251, which can turn on NFET 251 to draw the gate of ESD clamp device 241 to bias voltage V1. Use of the PGOOD signal in conjunction with clamp logic circuit 250 can ensure that only one of either the gated inverter 230 or the NFET 251 can draw the gate terminal G of the ESD clamp device 241 to a voltage in a particular time.

According to embodiments, bias voltage V1 can be a voltage below ground, for example, −0.2 V. In certain embodiments, bias voltage V1 can be in a range between 0.0 V and −0.3 V, with respect to ground. In certain embodiments, bias voltage V1 can be approximately −0.2 V, with respect to ground. Drawing the gate of ESD clamp device 241 to a voltage below ground can be useful to limit or reduce leakage current through ESD clamp device 241 to a significantly lower level leakage current I1 than leakage current I2.

Figure 3:
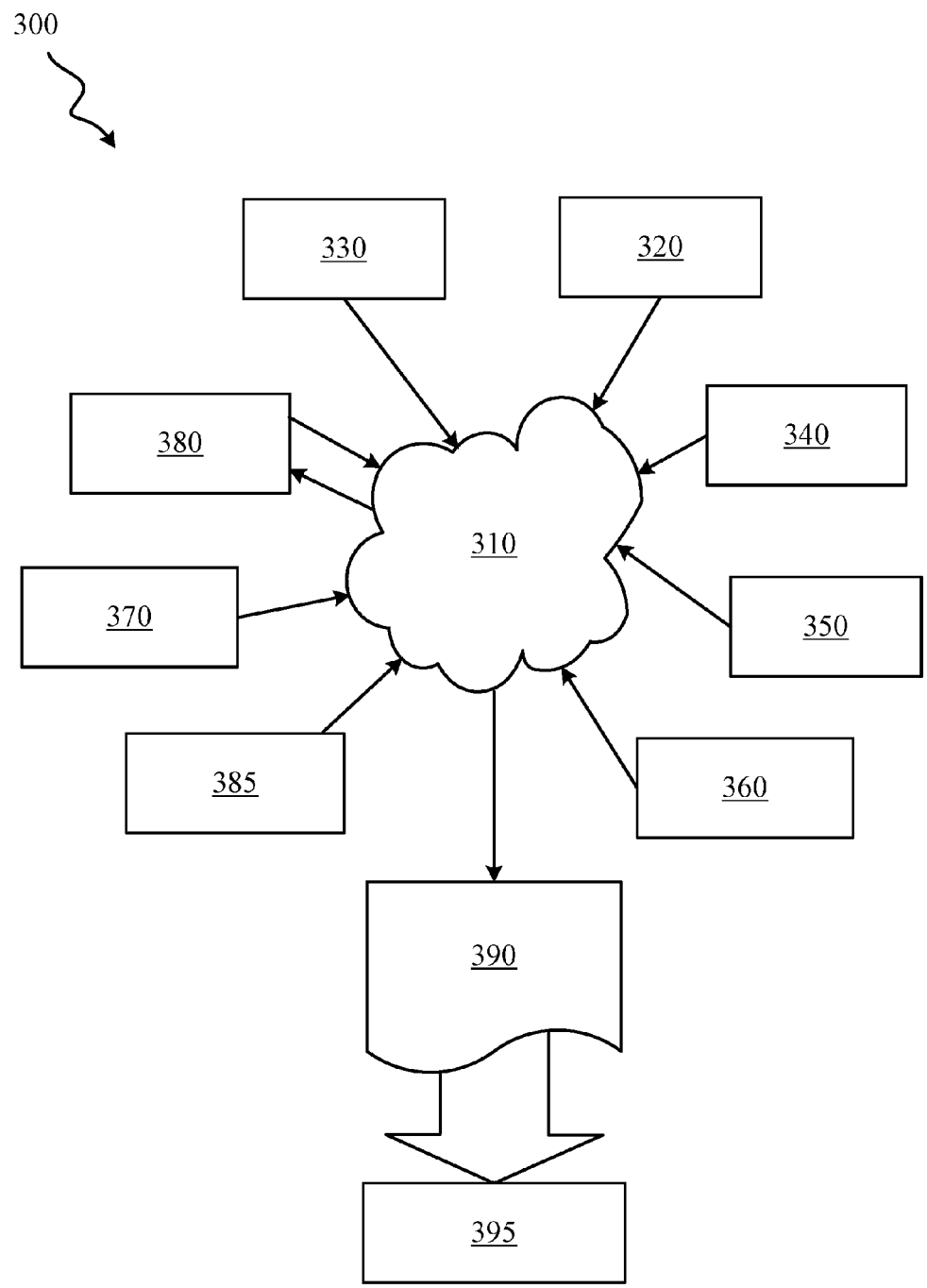
FIG. 3 depicts multiple design structures including an input design structure that can be processed by a design process, according to embodiments.

FIG. 3 illustrates multiple design structures 300 including an input design structure 320 that is preferably processed by a design process. Design structure 320 may be a logical simulation design structure generated and processed by design process 310 to produce a logically equivalent functional representation of a hardware device. Design structure 320 may alternatively include data or program instructions that, when processed by design process 310, generate a functional representation of the physical structure of a hardware device. Whether representing functional or structural design features, design structure 320 may be generated using electronic computer-aided design, such as that implemented by a core developer/designer. When encoded on a machine-readable data transmission, gate array, or storage medium, design structure 320 may be accessed and processed by one or more hardware or software modules within design process 310 to simulate or otherwise functionally represent an electronic component, circuit, electronic or logic module, apparatus, device, or system such as those shown in FIGS. 2 and 3. As such, design structure 320 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 310 preferably employs and incorporates hardware or software modules for synthesizing, translating, or otherwise processing a design/simulation functional equivalent of the components, circuits, devices, or logic structures shown in FIGS. 2 and 3 to generate a Netlist 380 which may contain design structures such as design structure 320. Netlist 380 may comprise, for example, compiled or otherwise processed data structures representing a list of wires, discrete components, logic gates, control circuits, I/O devices, models, etc., that describe the connections to other elements and circuits in an integrated circuit design. Netlist 380 may be synthesized using an iterative process in which Netlist 380 is resynthesized one or more times depending on design specifications and parameters for the device. As with other design structure types described herein, Netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology, e.g., different technology nodes, 32 nm, 45 nm, 90 nm, etc. The data structure types may further include design specifications 340, characterization data 350, verification data 360, design rules 350, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310, without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures, along with any additional mechanical design or data, to generate a second design structure 390. Design structure 390 resides on a storage medium or programmable gate array in a data format used for the exchange of data of mechanical devices and structures, e.g., information stored on an IGES, DXF, Parasolid XT, JT, DRG, or any other suitable format for storing or rendering such mechanical design structures. Similar to design structure 320, design structure 390 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2 and 3. In one embodiment, design structure 390 may comprise a compiled, executable HDL simulation model that functionally simulates the devices shown in FIGS. 2 and 3.

Design structure 390 may also employ a data format used for the exchange of layout data of integrated circuits and/or symbolic data format, e.g., information stored in a GDSII, GL1, OASIS, map files, or any other suitable format for storing such design data structures. Design structure 390 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1 and FIG. 2. Design structure 390 may then proceed to a state 395 where, for example, design structure 390 proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form, that is, as a single wafer that has multiple unpackaged chips, as a bare die, or in a packaged form. In the latter case the chip is mounted in a single chip package, such as a plastic carrier, with leads that are affixed to a motherboard or other higher level carrier, or in a multichip package, such as a ceramic carrier that has either or both surface interconnections or buried interconnections. In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An electrostatic discharge (ESD) protection device to manage leakage current, the ESD protection device comprising:
   a first N-channel field-effect transistor (NFET) configured to, in response to receiving a power good (PGOOD) signal at a gate terminal of the first NFET, draw a gate terminal of an ESD clamp device to a bias voltage less than ground, the ESD clamp device being a multi-channel NFET having a source terminal coupled to ground and a drain terminal coupled to a supply voltage, the ESD clamp device having an "on-state" impedance of less than 0.1Ω and configured to, in response to the gate terminal of the ESD clamp device being drawn to the bias voltage less than ground, allow a first leakage current to flow through the ESD clamp device, the ESD clamp device further configured to, in response to the gate terminal of the ESD clamp device being drawn to ground, allow a second leakage current to flow through the ESD clamp device, the first leakage current being less than the second leakage current;
   an inverter configured to, in response to receiving the PGOOD signal at an input of the inverter, drive an inverted copy of the PGOOD signal (PGOOD_N) to an enable input of a gated inverter;
   the gated inverter, the gated inverter including an output coupled to the gate terminal of the ESD clamp device, the gated inverter further including a second NFET, the second NFET having a source terminal connected to ground, the second NFET further having a drain terminal connected to a source terminal of a third NFET, and the second NFET further having a gate terminal connected to the enable input of the gated inverter, the second NFET configured to, in response to receiving the PGOOD_N signal, inhibit the output of the gated inverter from drawing the gate terminal of the ESD clamp device to ground;
   a resistor-capacitor (RC) circuit configured to generate, in response to a supply voltage node rising from ground to a specified supply voltage, a "voltage supply active" signal at an output of the RC circuit; and
   at least one pair of series-coupled inverters configured to couple the output of the RC circuit to an input of the gated inverter.

* * * * *